(12) United States Patent
Hayashi et al.

(10) Patent No.: US 6,225,184 B1
(45) Date of Patent: May 1, 2001

(54) SEMICONDUCTOR DEVICE MANUFACTURING METHOD

(75) Inventors: Manabu Hayashi; Yumiko Hamada, both of Kanagawa (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/265,570

(22) Filed: Mar. 10, 1999

(30) Foreign Application Priority Data

Mar. 13, 1998 (JP) .................................................. 10-063162

(51) Int. Cl.[7] ...................................................... H01L 21/20

(52) U.S. Cl. ............................................................ 438/396

(58) Field of Search .................................... 438/396, 397, 438/399, 618, 620, 666, 668, 767, 778, 712

(56) References Cited

U.S. PATENT DOCUMENTS 5,705,420  *  1/1998  Ema ......................................... 437/52
6,071,812  *  6/2000  Hsu et al. ............................. 438/668

* cited by examiner

Primary Examiner—David Nelms
Assistant Examiner—Quoc Hoang
(74) Attorney, Agent, or Firm—Arent Fox Kintner Plotkin & Kahn, PLLC

(57) ABSTRACT

A semiconductor device manufacturing method where the first insulating film, the first semiconductor film, and the second insulating film are formed in sequence on or above a semiconductor substrate. A resist mask having a window therein is formed on the second insulating film. A first hole is formed in the second insulating film via the window or the first hole is formed in the second insulating film and the first semiconductor film. An overetching using a halogen compound gas forms a sidewall on an inner peripheral surface of the first hole. A second hole having a small diameter than the first hole is formed by etching through the first hole surrounded by the sidewall and the resist.

20 Claims, 10 Drawing Sheets

SEMICONDUCTOR DEVICE MANUFACTURING METHOD

BACKGROUND OF THE INVENTION

1. Field of the Invention

The present invention relates to a semiconductor device manufacturing method and, more particularly, a semiconductor device manufacturing method including the step of forming contact holes.

2. Description of the Prior Art

A higher integration density of the semiconductor memory device such as DRAM (Dynamic Random Access Memory), FeRAM (Ferroelectric Random Access Memory), etc. has been advanced. In pursuant to such higher integration density, it is driven by necessity to reduce further diameters of the contact holes which are formed in an interlayer insulating film.

For example, a contact hole for connecting a fin-type capacitor and an impurity diffusion layer of the DRAM cell is formed along steps described in the following.

First, as shown in FIG. 1A, a first interlayer insulating film 103 is formed on active regions of a semiconductor substrate 101 and a field insulating film 102 which is formed around the active regions. Then, bit lines 104 are formed on the first interlayer insulating film 103. The bit lines 104 are connected to a part of the impurity diffusion layers formed in the active regions via contact holes (not shown) formed in the first interlayer insulating film 103 respectively.

In addition, a second interlayer insulating film 105 is formed on the bit lines 104 and the first interlayer insulating film 103, and then a first insulating film (SiN) 106 is formed thereon. Then, a plurality of second insulating films (SiO$_2$) 107 and first semiconductor (silicon) films 108 are formed alternatively on the first insulating film 106. Then, resist 109 is coated on the uppermost second insulating film 107, and then windows 109a are formed in the resist 109 by exposing and developing the resist 109. The windows 109a are formed over capacitor contact regions. The capacitor contact regions are placed over another impurity diffusion films 110 which are formed on the active regions.

Then, as shown in FIG. 1B, holes 111 are formed in respective films from the uppermost second insulating film 107 to the first interlayer insulating film 103 by etching such films successively via the windows 109a of the resist 109.

Then, the resist 109 is removed and then, as shown in FIG. 1C, a second silicon film 112 is formed in the holes 111 and on the uppermost second insulating film 107. Then, as shown in FIG. 1D, the second silicon film 112, the first silicon films 108, and the second insulating films 107 except for lowermost second insulating film 107 formed on the first insulating film 106 are patterned, so that these films are formed to have a planar shape of a storage electrode of the capacitor. Then, all the second insulating films 107 are selectively removed by using an etchant. As a result, as shown in FIG. 1E, fin-type storage electrodes 113 consisting of the first silicon films 108 and the second silicon film 112 appear on the semiconductor substrate 101.

In turn, as shown in FIG. 1F, a dielectric film 114 is formed on a surface of the fin-type storage electrodes 113, and then a silicon film serving as an opposing electrode 115 is formed on a surface of the dielectric film 114.

In the steps of forming the capacitor of the above DRAM, an i-line is employed in exposure when the windows 109a are formed in the resist 109 and a phase shifter is employed as an exposure mask.

However, even if the i-line and the phase shifter are employed in exposure of the resist 109, a diameter of the window 109a in the resist 109 is limited to about 0.31 μm at a minimum.

In order to reduce the diameter of the window 109a further, there is the technology in which an excimer stepper is applied to the exposing step. However, such technology has not been regularly spread yet.

SUMMARY OF THE INVENTION

It is an object of the present invention to provide a semiconductor device manufacturing method including the step of forming holes each having an infinitesimal diameter which exceeds the limit or critical value in the existing exposure technology.

According to the present invention, when the a contact hole which is employed to connect electrically the storage electrode constituting the capacitor to the impurity diffusion layer on the semiconductor substrate is formed, the first insulating film, the first semiconductor film, and the second insulating film are formed in sequence on or above a semiconductor substrate, then the resist mask having a window therein is formed on the second insulating film, then a first hole is formed in the second insulating film via the window or the first hole is formed in the second insulating film and the first semiconductor film, then an overetching using a halogen compound gas is performed to form a sidewall on an inner peripheral surface of the first hole, and then a second hole having a small diameter are formed by etching through the first hole surrounded by the sidewall and the resist.

Accordingly, the diameter of the second hole which are placed below the sidewall isreduced smaller than those in the prior art, so that a higher integration density of the capacitor is accomplished.

Moreover, since the diameter of the first hole (i.e., the upper part of the contact hole) is formed larger than the diameter of the second hole (i.e., the lower part of the contact hole), the step coverage of the conductive film which is formed in the contact hole and on the second insulating film is improved.

DESCRIPTION OF THE PREFERRED EMBODIMENTS

Therefore, embodiments of the present invention will be explained in detail with reference to the accompanying drawings hereinafter.

An arrangement of a transfer transistor and a capacitor, which constitutes one DRAM cell in a semiconductor device according to a first embodiment of the present invention, is shown in a plan view of FIG. 1, for example.

Figure 1A:
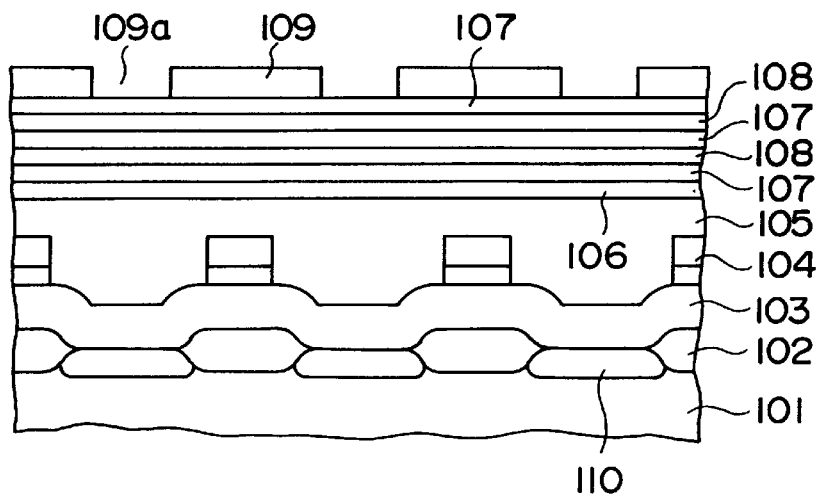
FIGS. 1A to 1F are sectional views showing steps of manufacturing the semiconductor device in the prior art respectively.
Figure 1B:
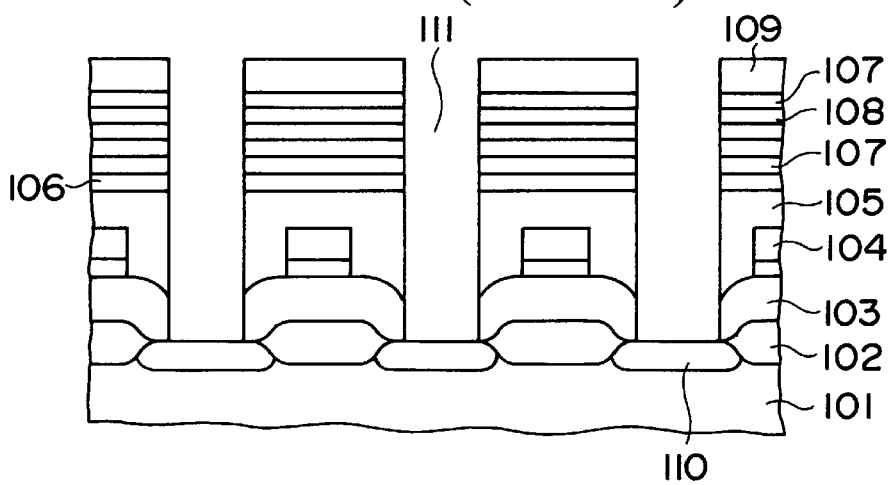
Figure 1C:
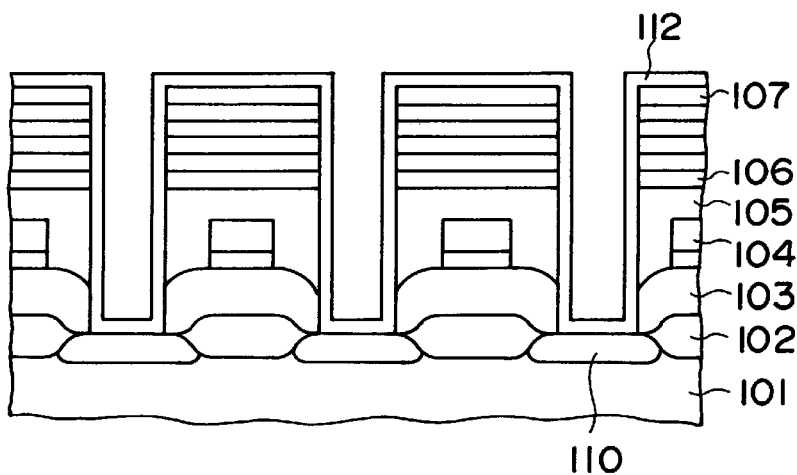
Figure 1D:
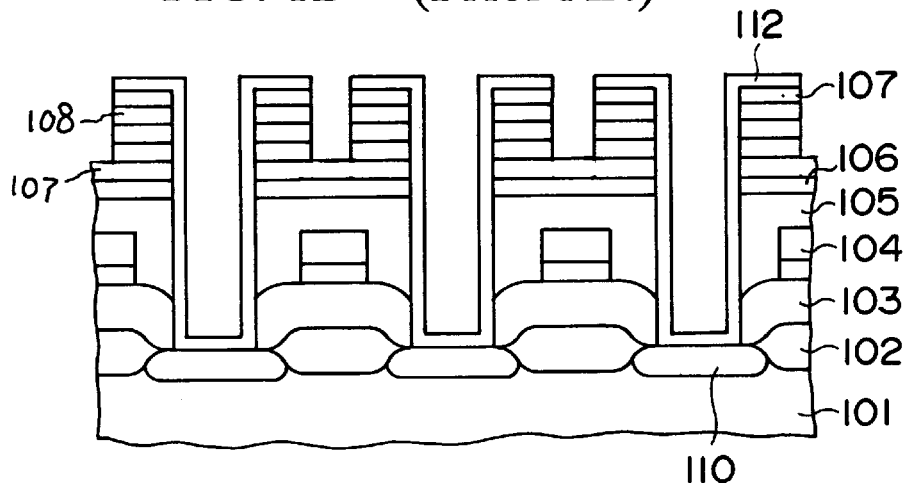
Figure 1E:
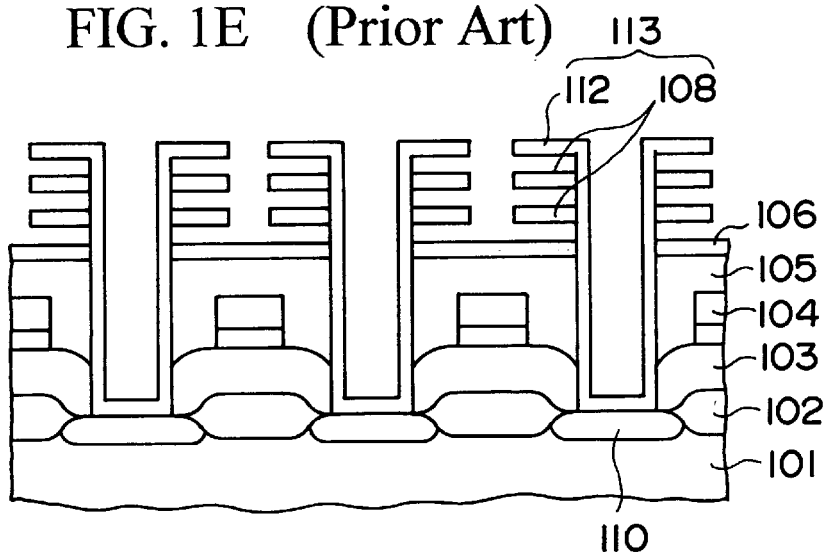
Figure 1F:
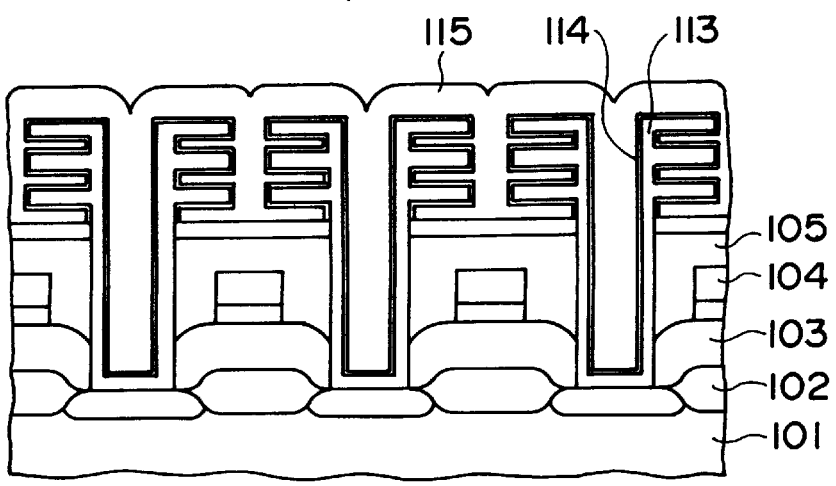
Figure 2:
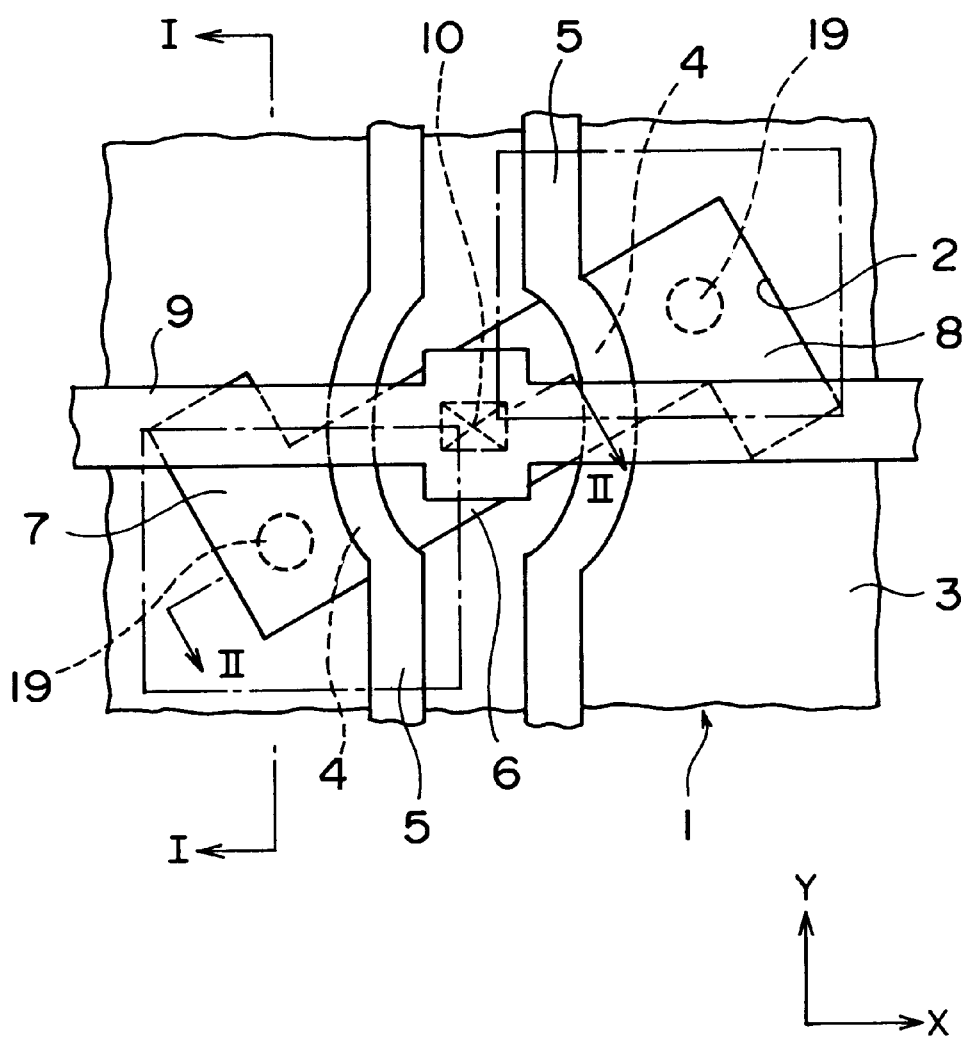
FIG. 2 is a plan view showing a semiconductor device according to a first embodiment of the present invention.

In FIG. 2, a field oxide film 3 surrounding active regions 2 is formed on a surface of the silicon substrate (semiconductor substrate) 1. Then, a plurality of word lines 5 are formed at a distance on surfaces of the active regions 2 on the silicon substrate 1 via a gate insulating film 4.

The field oxide film 3 is formed by a selective oxidation method while using a silicon nitride film as a mask. The gate insulating film 4 is formed by thermally oxidizing a surface of the silicon substrate 1. The word lines 5 are formed such that they extend in the Y direction in FIG. 1 to pass over the field oxide film 3 and then pass over another active region 2.

A first impurity diffusion layer 6 is formed on the active region 2 between two word lines 5. Then, a second impurity diffusion layer 7 and a third impurity diffusion layer 8 are formed on the opposite side portion to the first impurity diffusion layer 6 relative to the word lines 5. The first to third impurity diffusion layers 6 to 8 are formed by ion-implanting impurities in a self-alignment manner by using the word lines 5 as a mask.

The word lines 5, the active region 2, and the field oxide film 3 are covered with a first interlayer insulating film 11 described later. In order to facilitate the understanding of an arrangement of constituent elements of the DRAM cell, the first interlayer insulating film 11 is omitted from FIG. 2.

A plurality of bit lines 9 which extend in the X direction in FIG. 1 are formed on the first interlayer insulating film 11 at a distance. One bit line 9 is electrically connected to the first impurity diffusion layer 6 via a contact hole 10 in the first interlayer insulating film 11. Also, the storage electrode (lower electrode) of the capacitor is connected to the second and third impurity diffusion layers 7, 8 respectively via steps described later.

Next, steps of forming the capacitor will be explained with reference to FIGS. 3A to 3I and FIGS. 4A to 4E hereunder.

Figure 3A:
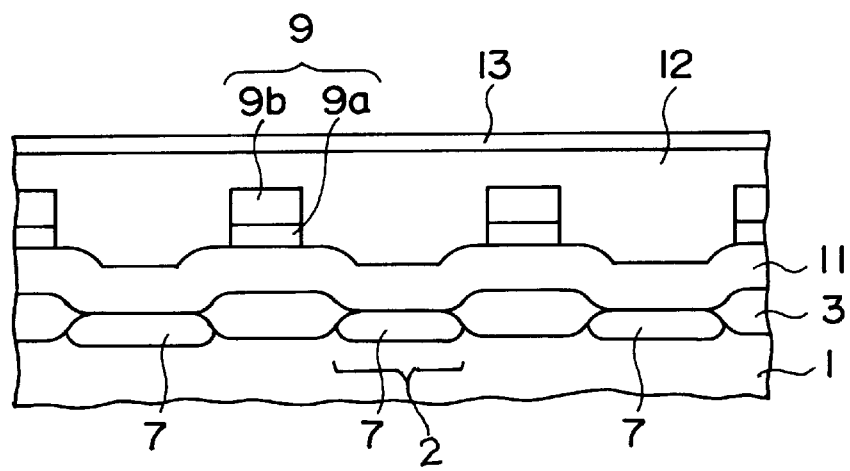
FIGS. 3A to 3I are sectional views, when taken along a line I—I in FIG. 2, showing steps of manufacturing the semiconductor device according to the first embodiment of the present invention respectively.
Figure 4A:
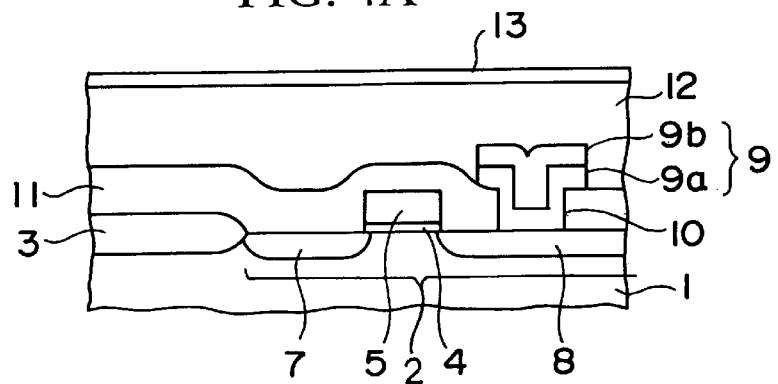
FIGS. 4A to 4E are sectional views, when taken along a line II—II in FIG. 2, showing steps of manufacturing the semiconductor device according to the first embodiment of the present invention respectively.

FIG. 3A is a sectional view when viewed from a line I—I in FIG. 2, and FIG. 4A is a sectional view when viewed from a line II—II in FIG. 2. The second impurity diffusion layers 7 in the active regions 2 are shown in FIG. 3A, and one transfer gate which employs the word line 5 as the gate electrode is shown in FIG. 4A.

At first, as shown in FIG. 3A and FIG. 4A, the word lines 5, the active regions 2, the field oxide film 3 are covered with the first interlayer insulating film 11 which consists of $SiO_2$ film and BPSG (boro-phospho silicate glass) film, and then the bit lines 9 are formed on the first interlayer insulating film 11. Each of the bit lines 9 is composed of a lower layer portion 9a which is formed of impurity containing silicon and an upper layer portion 9b which is formed of tungsten silicide.

Then, a second interlayer insulating film 12 made of BPSG is formed on the bit line 9 and the first interlayer insulating film 11. After the second interlayer insulating film 12 is reflowed by annealing, an etching stop layer 13 made of silicon nitride is formed on the first interlayer insulating film 11 and the bit lines 9 by the chemical vapor deposition.

Figure 3B:
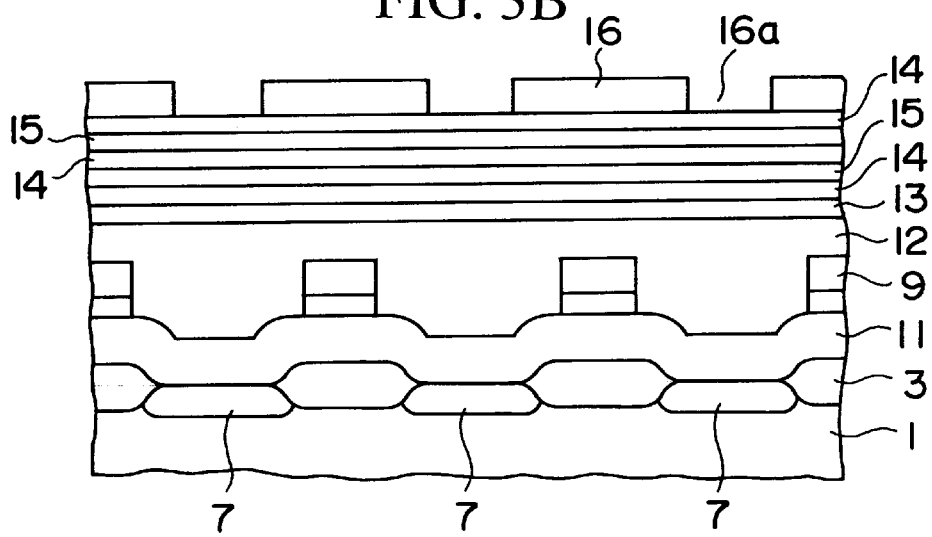
Figure 4B:
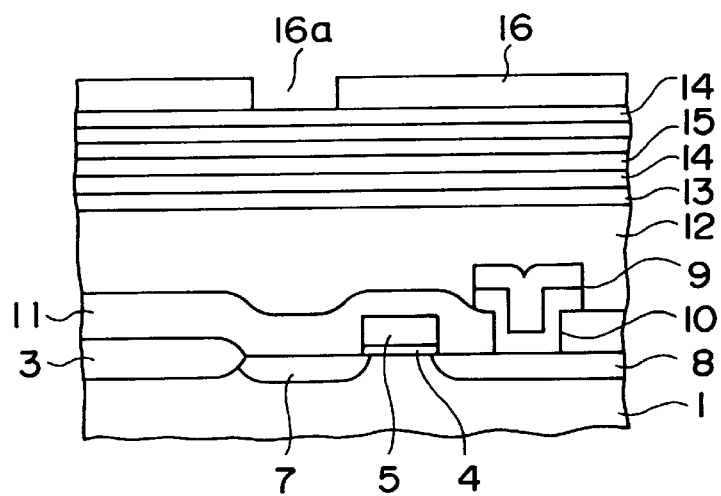

Next, as shown in FIGS. 3B and 4B, an interlayer insulating film 14 formed of $SiO_2$ and a first semiconductor film 15 formed of either amorphous silicon or polysilicon are formed on the etching stop layer 13 by the CVD method. Otherwise, a plurality of interlayer insulating films 14 and first semiconductor films 15 may be formed alternatively. Impurity such as phosphorus (P), arsenic (As), or the like is contained in the first semiconductor film 15 to lower its resistance. The impurity may be introduced simultaneously when the first semiconductor film 15 is grown or after the first semiconductor film 15 has been grown. The interlayer insulating films 14 are formed on the first semiconductor films 15 respectively.

Then, photosensitive positive resist 16 made of Novorak material is coated on the uppermost interlayer insulating film 14, and then windows 16a employed to form contact holes are formed over the second impurity diffusion layer 7 and the third impurity diffusion layer 8 respectively by exposing and developing the photosensitive positive resist 16.

Subsequently, the uppermost interlayer insulating film 14 is etched anisotropically via the windows 16a in the vertical direction by the reactive ion etching (RIE) method. As a reaction gas in etching, a mixed gas composed of a fluorocarbon series gas such as $CH_2F_2$, $CH_3F$, $CF_4$, $CHF_3$, $C_4F_8$, or $C_5F_8$ and an argon gas is employed. If such fluorocarbon series gas is employed, a selective etching ratio of $SiO_2$ to silicon can be enhanced.

Figure 3C:
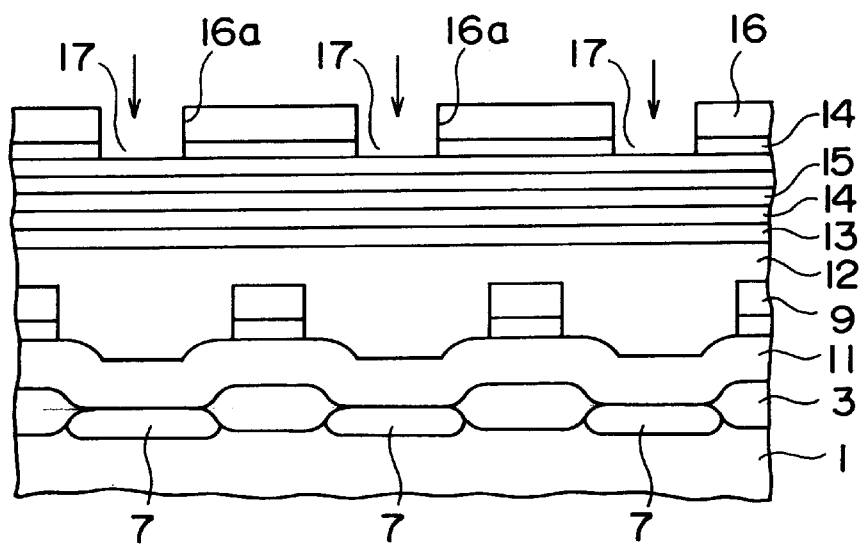
Figure 3D:
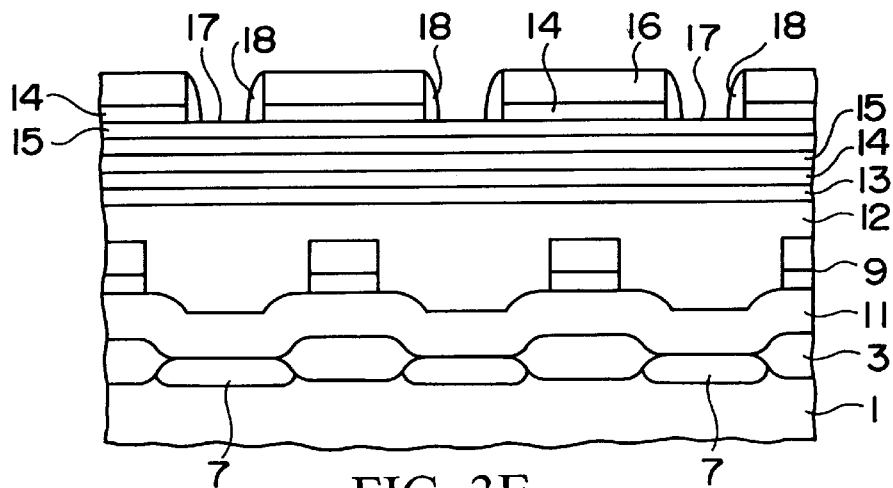
Figure 4C:
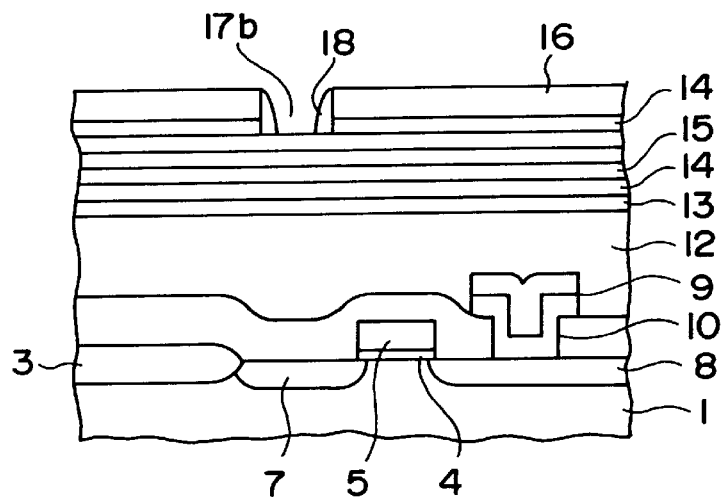

As shown in FIG. 3C, holes 17 are opened in the interlayer insulating film 14 by executing this etching until a part of the uppermost first semiconductor film 15 is exposed. If overetching is executed while maintaining such etching state after the holes 17 have been opened, material containing a component of the photosensitive positive resist 16 is adhered onto an inner peripheries of the holes 17 and therefore sidewalls 18 are formed, as shown in FIGS. 3D and 4C.

More particularly, if supply of oxygen which is generated by etching the oxide is interrupted after the holes 17 have been formed by etching anisotropically the interlayer insulating film 14 made of the oxide, the growth of material which is composed of $(CF_2)_x$ polymer and carbon is increased quickly due to the reaction between the fluorocarbon series gas and the photosensitive positive resist 16, so that such material remains as sidewalls 18 in the holes 17. In this case, polymer-containing material, which is grown on the center bottom of the holes 17, is removed according to an ion sputtering effect caused by the RIE along the vertical direction. As a result, the polymer-containing material is grown only on an inner peripheral surface of the hole 17, and therefore a diameter of the hole 17 would be reduced substantially.

Assume that an etching time required until the first silicon film, for example, is exposed is set to 100%, such overetching state must be kept at 200% or more, preferably 700%.

Normally such overetching of the interlayer insulating film 14 is set to about 30% of its just etching, e.g., is applied for about two seconds, but such etching is set larger than that value in this embodiment. In the case that a film thickness of the uppermost interlayer insulating film 14 is 35 to 60 nm and an etching rate is 420 nm/min, such overetching must be carried out for at least 40 seconds.

The diameter of the hole 17 would be reduced substantially because of formation of the sidewall 18. Hence, if a production limit for the diameter of the window 16a of the photosensitive positive resist 16 is assumed as 0.31 μm, the hole 17 which has a smaller diameter than this value is formed.

Experimental relationships among the etching time of the uppermost interlayer insulating film 14, the overetching time, and the substantial diameter of the hole 17 are shown in Table 1. Based on Table 1, it is evident that the holes each having a diameter which is smaller than the limit of the diameter of the window 16a of the photosensitive positive resist 16, which is formed by using the i-line, can be formed.

TABLE 1

| Total[sec] | Just[sec] + Over[sec] | Etching Over[%] | Bottom Dia. [μm] |
|---|---|---|---|
| 7 | 5 + 2 | 40 | 0.18 |
| 20 | 5 + 15 | 300 | 0.123 |
| 40 | 5 + 35 | 700 | 0.076 |

Figure 3E:
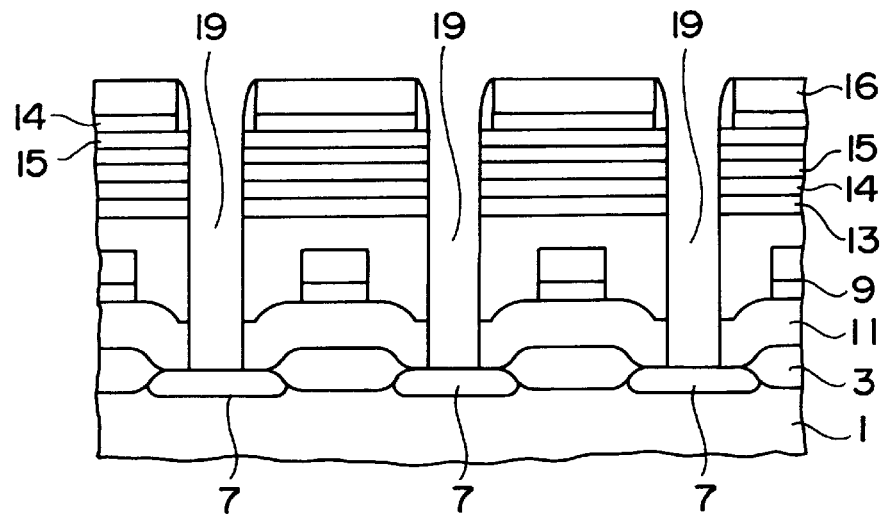

After formation of the sidewall 18 has been completed, if contact holes 19 shown in FIG. 3E are formed by etching the first semiconductor film 15 and the interlayer insulating film 14 located below the holes 17 with using the photosensitive positive resist 16 and the sidewalls 18 as a mask, a part of the second impurity diffusion layer 7 and the third impurity diffusion layer 8 is exposed. A diameter of the contact hole 19 becomes substantially identical to a bottom diameter of the hole surrounded by the sidewall 18.

After this, when the photosensitive positive resist 16 is removed by ashing using oxygen plasma, the sidewalls 18 which contains the polymer-containing material can be removed simultaneously.

Figure 4D:
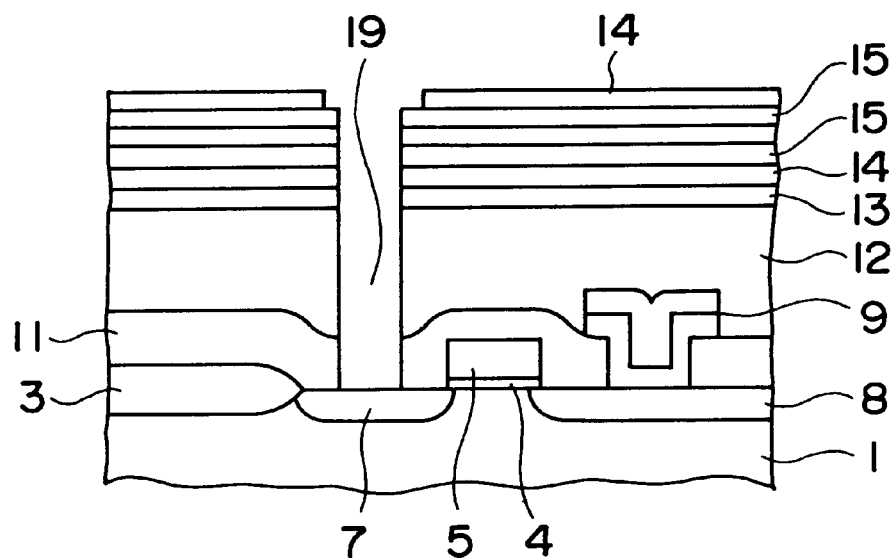

Since the diameter of the contact holes 19 formed in the range of the first semiconductor film 15 becomes substantially equal to those of the windows 16a of the photosensitive positive resist 16, taper structures are formed in uppermost areas of the contact holes 19 respectively, as shown in FIG. 4D.

Figure 3F:
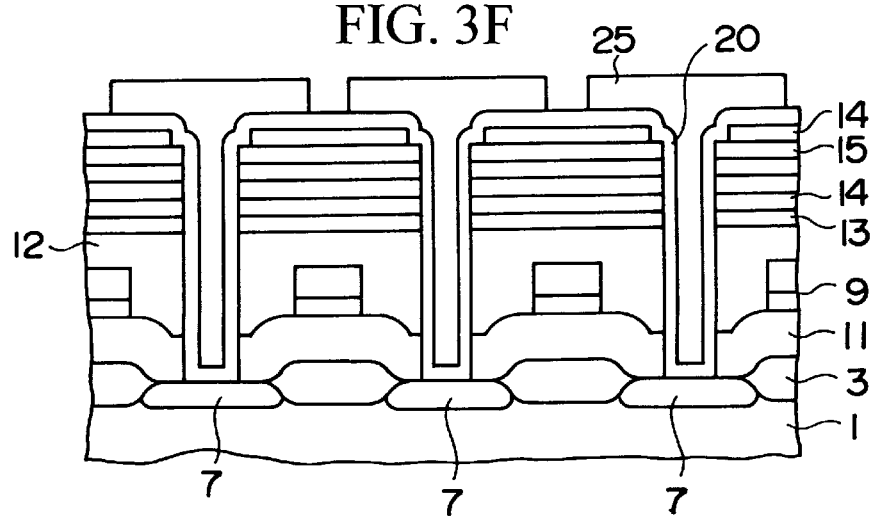

Then, as shown in FIG. 3F, a second semiconductor film 20 is formed on an upper surface of the uppermost interlayer insulating film 14 and along inner surfaces of the contact holes 19 by the chemical vapor deposition method. In this case, since the diameters of the contact holes 19 are extended locally at their upper edges, the second semiconductor film 20 having good step coverage can be formed. This second semiconductor film 20 is composed of amorphous silicon or polysilicon.

Then, as shown in FIG. 3F, second photosensitive positive resist 25 is formed on the second semiconductor film 20, and storage electrodes of the capacitors are patterned by exposing and developing the second photosensitive positive resist 25. The contact holes 19 are contained in storage-electrode forming regions.

Then, the first semiconductor film 15 and the second semiconductor film 20 are patterned into shapes of storage electrodes 21 by etching the first semiconductor film 15, the second semiconductor film 20, and the interlayer insulating film 14 except for the lowermost interlayer insulating film 14 on the etching stop layer 13 while using the second photosensitive positive resist 25 as a mask.

Figure 3G:
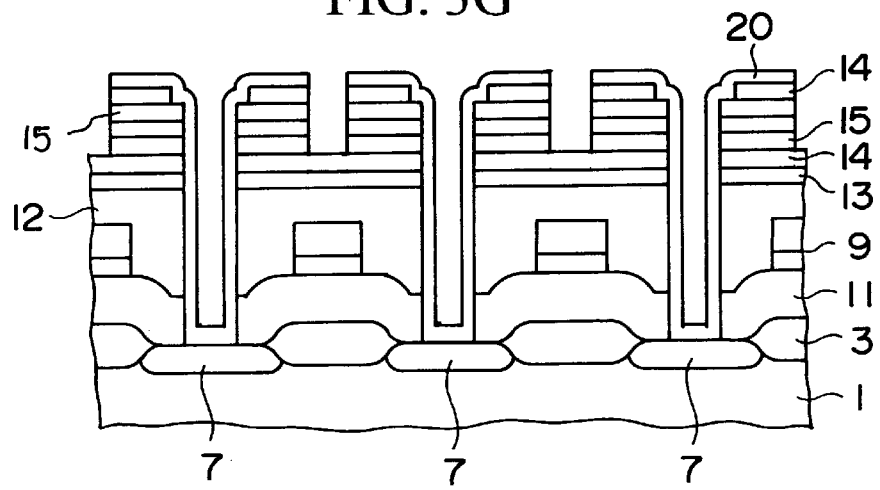

Nest, a sectional shape shown in FIG. 3G is derived by removing the first interlayer insulating film 11.

Figure 3H:
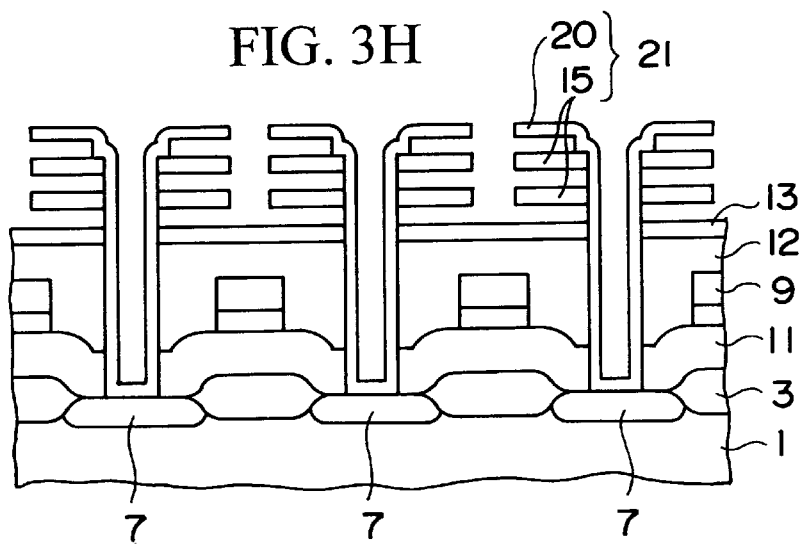

In turn, if the interlayer insulating film 14 is selectively removed using hydrofluoric acid, a sectional shape shown in FIG. 3H can be derived, whereby surfaces of the storage electrodes 21 which consist of the first semiconductor film 15 and the second semiconductor film 20 respectively can be exposed from the etching stop layer 13.

Figure 3I:
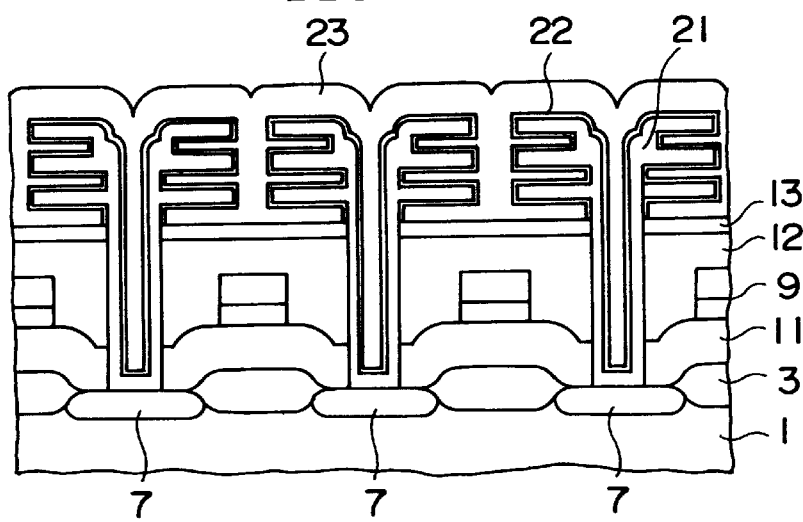
Figure 4E:
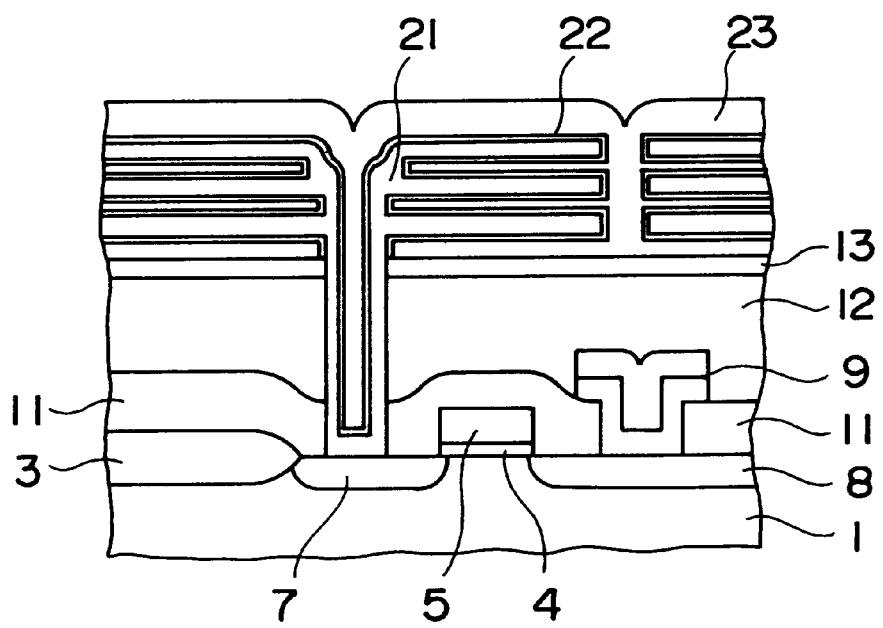

Then, as shown in FIGS. 3I and 4E, a dielectric film 22 formed of $SiO_2$ and SiN is formed on the surfaces of the storage electrodes 21, and then an opposing electrode 23 made of impurity-containing silicon is formed by the CVD method.

According to the above steps, the diameters of the contact holes 19 which are employed to connect the storage electrodes of the capacitors to the impurity diffusion layers can be reduced smaller than those in the prior art and the second semiconductor film 20 for the storage electrodes, which has good step coverage, can also be formed. As a result, higher integration density and improvement in yield of the DRAM can be achieved.

Meanwhile, in the above embodiment of the present invention, after the holes 17 have been formed in the uppermost interlayer insulating film 14, the sidewalls 18 are formed by using a fluorine series gas. But a halogen compound gas except for the fluorine series gas may be employed.

Figure 5A:
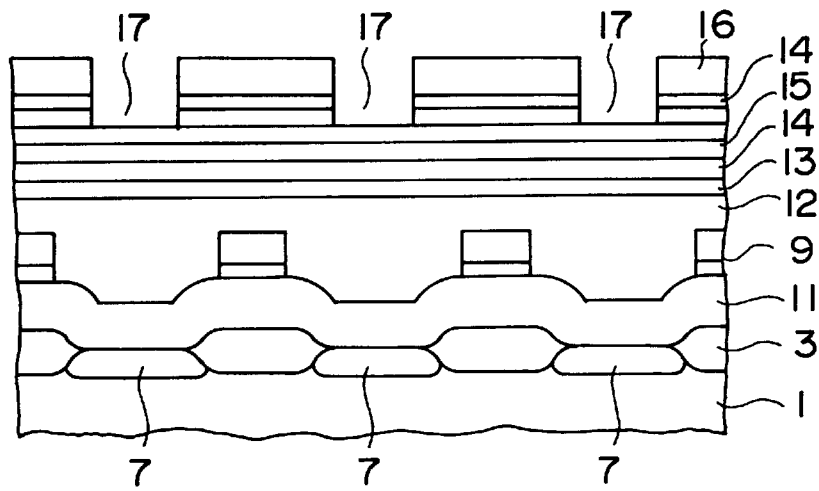
FIGS. 5A to 5F are sectional views showing a semiconductor device according to a second embodiment of the present invention.
Figure 5B:
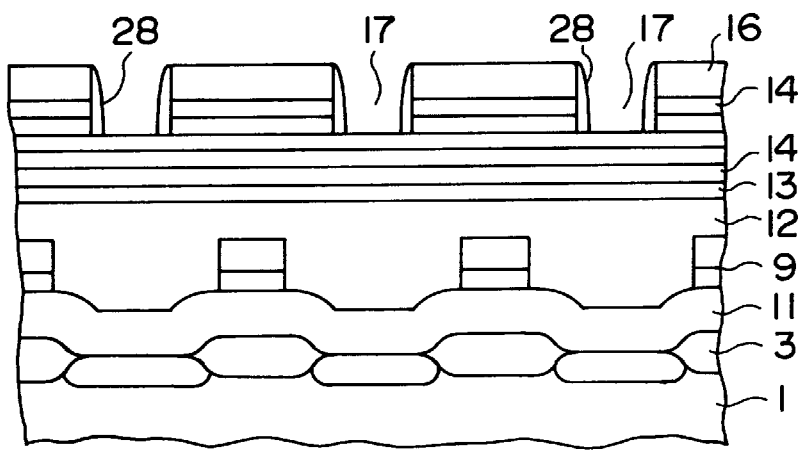

For instance, after the holes 17 have been formed, as shown in FIG. 3C, by etching the uppermost interlayer insulating film 14 via the windows 16a of the photosensitive positive resist 16, if the holes 17 are made deeper, as shown in FIG. 5A, by etching the uppermost first semiconductor layer 15 by the RIE using a chlorine series gas such as HCl, $Cl_2$ or a bromine series gas such as HBr and then the overetching of more than 200% is effected, sidewalls 28 containing polymer are formed on the inner surfaces of the holes 17, as shown in FIG. 5B, to thus reduce substantially the diameters of the holes 17.

Figure 5C:
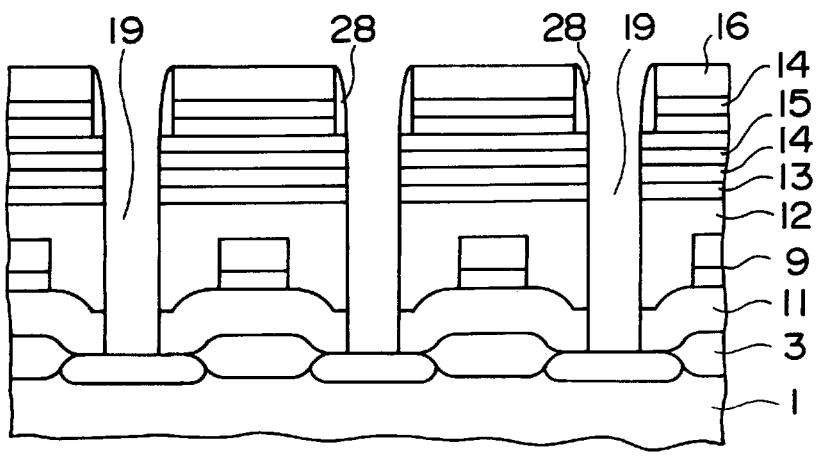

Then, as shown in FIG. 5C, while using the photosensitive positive resist 16 and the sidewalls 28 as a mask, the contact holes 19 are formed by etching respective layers located below the holes 17 up to the first interlayer insulating film 11 to thus expose a part of the second impurity diffusion layer 7 and the third impurity diffusion layer 8. Since the sidewalls 28 contain silicon, it is difficult to remove them simultaneously with the removal of the photosensitive positive resist 16. Therefore, the sidewalls 28 are removed by the hydrofluoric acid being diluted to 0.5% or 5%, for example, for about 30 seconds.

Figure 5D:
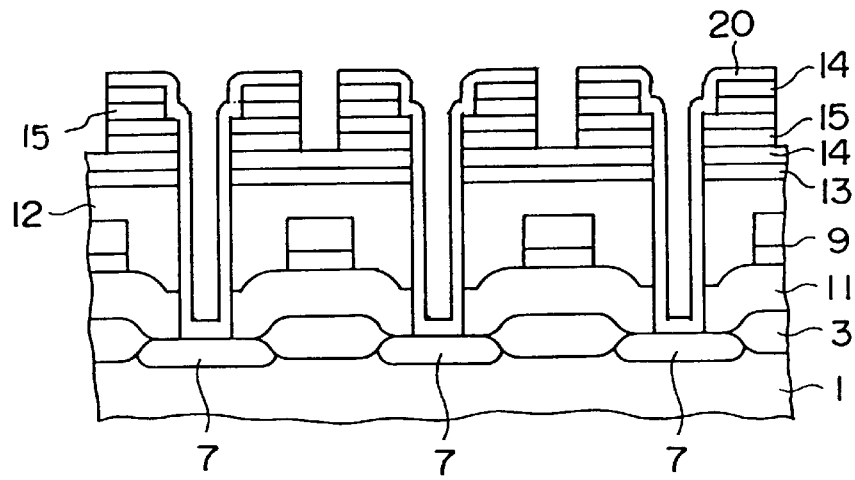
Figure 5E:
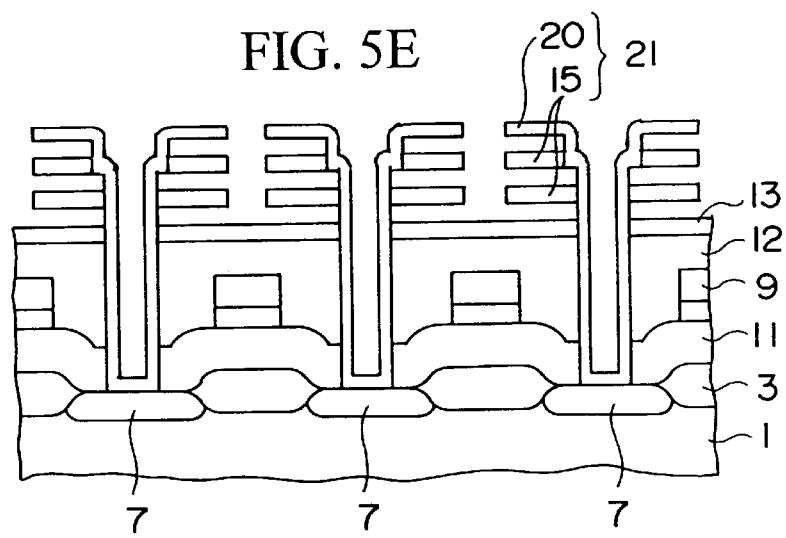
Figure 5F:
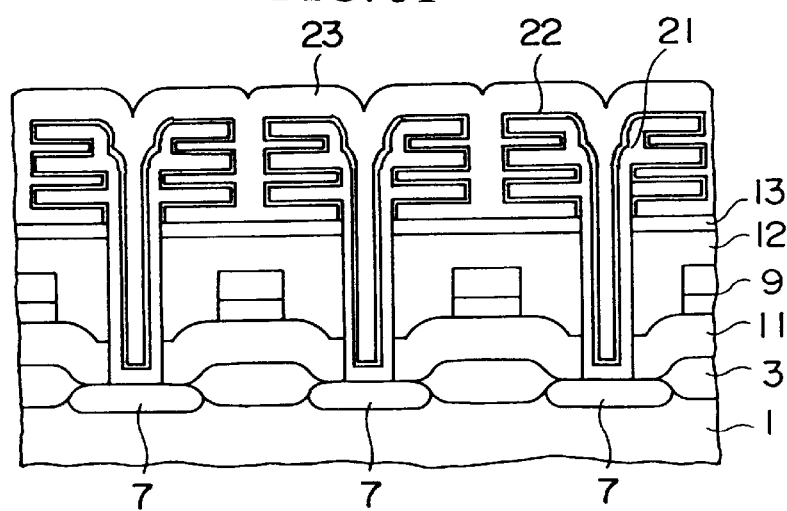

Succeeding steps can be performed along and FIGS. 5D to 5F.

The diameters of the contact holes 19 being formed as above can be made smaller than those in the prior art. In addition, step coverage of the second semiconductor layer 20 formed in the contact holes 19 can be improved.

By the way, in addition to the polysilicon film or the amorphous silicon film, a HSG (hemispherical grain) silicon film or a ragged polysilicon film having large surface unevenness, which is obtained by growing an doped amorphous silicon layer at the low temperature of about 450 to 550° C. and then annealing such doped amorphous silicon layer, may be employed as the semiconductor layer constituting the storage electrodes 21.

Also, as the interlayer insulating film 14, either BPSG, PSG containing the impurity or spin-coated SOG may be employed.

As described above, according to the present invention, in case the contact holes which are employed to connect the storage electrodes constituting the capacitor to the impurity diffusion layers on the semiconductor substrate are formed, the first insulating film, the first semiconductor film, and the second insulating film are formed on the semiconductor substrate, then the resist mask having the windows therein is formed on the second insulating film, then the holes are formed in the second insulating film via the windows or the holes are formed to reach the first semiconductor film, and then the overetching using the fluorocarbon series gas is performed to form the sidewalls on the inner peripheral surfaces of the holes, whereby the diameters of the holes are reduced. As a result, the contact holes each having the small diameter can be formed by etching the respective layers which are formed below the sidewalls.

Moreover, since the upper diameters of the contact holes can be formed larger than the lower diameters thereof, step coverage of the conductive film which is formed in the contact holes and on the second insulating film can be improved.

What is claimed is:

1. A semiconductor device manufacturing method comprising the steps of:

forming a first insulating film on a substrate which has an impurity diffusion layer;

forming a first semiconductor film on the first insulating film;

forming a second insulating film, which is formed of material different from the first insulating film, on the first semiconductor film;

coating a photosensitive resist on the second insulating film;

forming a window in the photosensitive resist over the impurity diffusion layer by exposing and developing the photosensitive resist;

forming a first hole in the second insulating film by etching the second insulating film selectively for a first period of time through the window using a halogen compound gas;

keeping still an etching state employing the halogen compound gas for a second period of time which is more than the first period of time, after the first hole has been formed, thereby forming a sidewall containing a component of the photosensitive resist on an inner peripheral surface of the first hole to reduce substantial diameter of the first hole;

forming a second hole above the impurity diffusion layer by etching the first semiconductor film, and the first insulating film through the first hole while using the sidewall and photosensitive resist as a mask;

removing the photosensitive resist and the sidewall;

forming a second semiconductor film in the first and second holes and on an upper face of the second insulating film;

forming a storage electrode made of the first semiconductor film and the second semiconductor film in region including the first and second holes by patterning the second semiconductor film, the second insulating film, and the first semiconductor film;

removing selectively the second insulating film;

forming a dielectric film on a surface of the storage electrode; and forming an opposing electrode of the capacitor on a surface of the dielectric film.

2. A semiconductor device manufacturing method according to claim 1, wherein the second period of time is more than 200% of the first period of time.

3. A semiconductor device manufacturing method according to claim 1, wherein the halogen compound gas is a fluorocarbon series gas.

4. A semiconductor device manufacturing method according to claim 1, wherein the second insulating film is also formed between the first semiconductor film and the first insulating film.

5. A semiconductor device manufacturing method according to claim 1, wherein the first semiconductor film and the second insulating film are formed alternatively to constitute a multi-layered structure.

6. A semiconductor device manufacturing method according to claim 1, wherein the first or second semiconductor film is a polysilicon or amorphous silicon film containing impurity.

7. A semiconductor device manufacturing method according to claim 6, wherein the impurity is introduced simultaneously with growth of the silicon film or after the silicon film has been grown later.

8. A semiconductor device manufacturing method according to claim 1, wherein the second insulating film is formed of material which contains silicon oxide.

9. A semiconductor device manufacturing method according to claim 1, wherein the first insulating film is formed of a silicon nitride.

10. A semiconductor device manufacturing method according to claim 1, further comprising the steps of:

forming a third insulating film between the first insulating film and the substrate; and forming the second hole also in the third insulating film.

11. A semiconductor device manufacturing method comprising the steps of:

forming a first insulating film on a substrate which has an impurity diffusion layer;

forming a first semiconductor film on the first insulating film;

forming a second insulating film, which is formed of material different from the first insulating film, on the first semiconductor film;

coating a photosensitive resist on the second insulating film;

forming a window in the photosensitive resist over the impurity diffusion layer by exposing and developing the photosensitive resist;

forming a first hole in the second insulating film by etching the second insulating film selectively through the window using a first halogen compound gas;

making the first hole deeper by etching the first semiconductor film using a second halogen compound gas other than the first halogen compound gas through the window and the first hole for a first period of time;

keeping still an etching state employing the second halogen compound gas for a second period of time which is more than the first period of time, thereby forming a sidewall containing a component of the photosensitive resist on the inner peripheral surfaces of the first hole to reduce substantial diameter of the first hole;

forming a second hole above the impurity diffusion layer by etching the first insulating film through the first hole while using the sidewall and the photosensitive resist as a mask;

removing the photosensitive resist and the sidewall;

forming a second semiconductor film in the first and second holes and on an upper face of the second insulating film;

forming a storage electrode made of the first semiconductor film and the second semiconductor film in region including the first and second hole by patterning the second semiconductor film, the second insulating film, and the first semiconductor film;

removing selectively the second insulating film;

forming a dielectric film on a surface of the storage electrode; and forming an opposing electrode of the capacitor on a surface of the dielectric film.

12. A semiconductor device manufacturing method according to claim 11, wherein the second period of time is more than 200% of the first period of time.

13. A semiconductor device manufacturing method according to claim 11, wherein the first halogen compound gas is a fluorocarbon series gas.

14. A semiconductor device manufacturing method according to claim 11, wherein the second insulating film is also formed between the first semiconductor film and the first insulating film.

15. A semiconductor device manufacturing method according to claim 11, wherein the first semiconductor film and the second insulating film are formed alternatively to constitute a multi-layered structure.

16. A semiconductor device manufacturing method according to claim 11, wherein the first or second semiconductor film is a polysilicon or amorphous silicon film containing impurity.

17. A semiconductor device manufacturing method according to claim 16, wherein the impurity is introduced simultaneously with growth of the silicon film or after the silicon film has been grown later.

18. A semiconductor device manufacturing method according to claim 11, wherein the second insulating film is formed of material which contains silicon oxide.

19. A semiconductor device manufacturing method according to claim 11, wherein the first insulating film is formed of a silicon nitride.

20. A semiconductor device manufacturing method according to claim 11, further comprising steps of:

forming a third insulating film between the first insulating film and the substrate; and forming the second hole also in the third insulating film.

* * * * *